United States Patent [19]

Arasawa et al.

[11] Patent Number: 5,622,593
[45] Date of Patent: Apr. 22, 1997

[54] PLASMA PROCESSING APPARATUS AND METHOD

[75] Inventors: Masashi Arasawa, Enzan; Katsuhiko Ono, Yamanashi-ken; Hiroshi Nishikawa; Kazuo Tsuchiya, both of Tokyo, all of Japan

[73] Assignees: Tokyo Electron Limited, Tokyo; Tokyo Electron Yamanashi Limited, Nirasaki, both of Japan

[21] Appl. No.: 658,557

[22] Filed: Jun. 5, 1996

Related U.S. Application Data

[63] Continuation of Ser. No. 361,579, Dec. 22, 1994, Pat. No. 5,547,539.

[30] Foreign Application Priority Data

Dec. 22, 1993 [JP] Japan .................... 5-346385
Jun. 20, 1994 [JP] Japan .................... 6-162706

[51] Int. Cl.$^6$ .................................................. H01L 21/00
[52] U.S. Cl. .................................................. 156/345
[58] Field of Search ........................ 156/626.1, 627.1, 156/643.1, 657.1, 662.1, 345 MC, 345 P; 216/58, 67; 118/712, 724; 204/298.32, 298.33

[56] References Cited

U.S. PATENT DOCUMENTS 5,460,684  10/1995  Saeki et al. .................... 156/345 P Primary Examiner—William Powell
Attorney, Agent, or Firm—Oblon, Spivak, McClelland, Maier & Neustadt, P.C.

[57] ABSTRACT

A plasma processing apparatus comprises a first passage opened in a top of suscepter at a peripheral area thereof, a first gas supply source for supplying heat exchange gas into a small clearance between the suscepter and a wafer through the first passage, a first vacuum pump for exhausting the clearance through the first passage, a second passage opened in the top of the suscepter at a center area thereof, a second gas supply source for supplying heat exchange gas into the clearance through the second passage, a second vacuum pump for exhausting the clearance through the second passage, and a controller for controlling the first and second gas supply sources and the first and second vacuum pumps independently of the others in such a way that backpressure caused in the second passage by the second gas supply source and vacuum pump can become lower than backpressure caused in the first passage by the first gas supply source and vacuum pump.

18 Claims, 8 Drawing Sheets

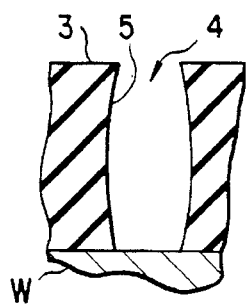
F I G. 1
(PRIOR ART)
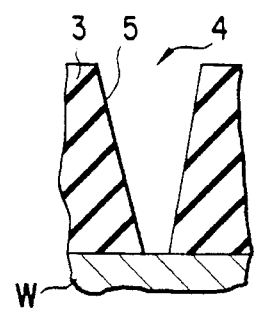
F I G. 2
(PRIOR ART)
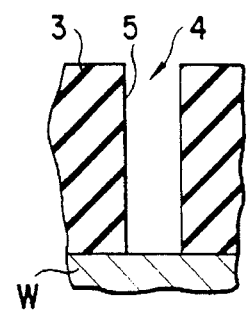
F I G. 3
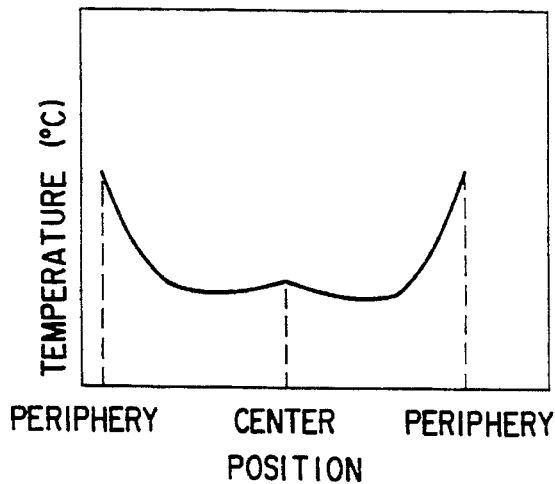
F I G. 4
(PRIOR ART)
F I G. 5
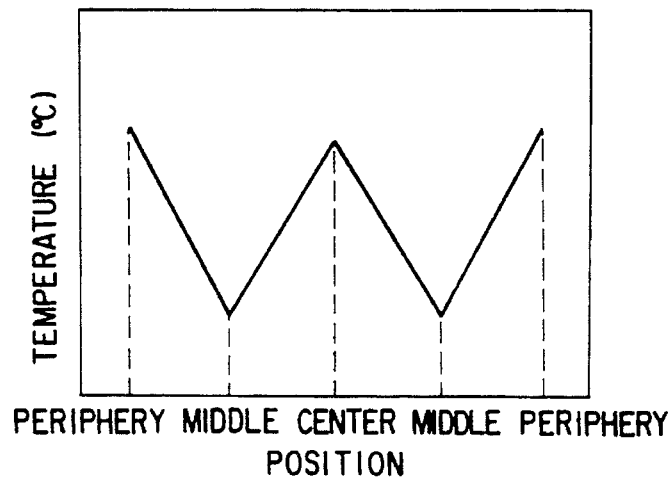

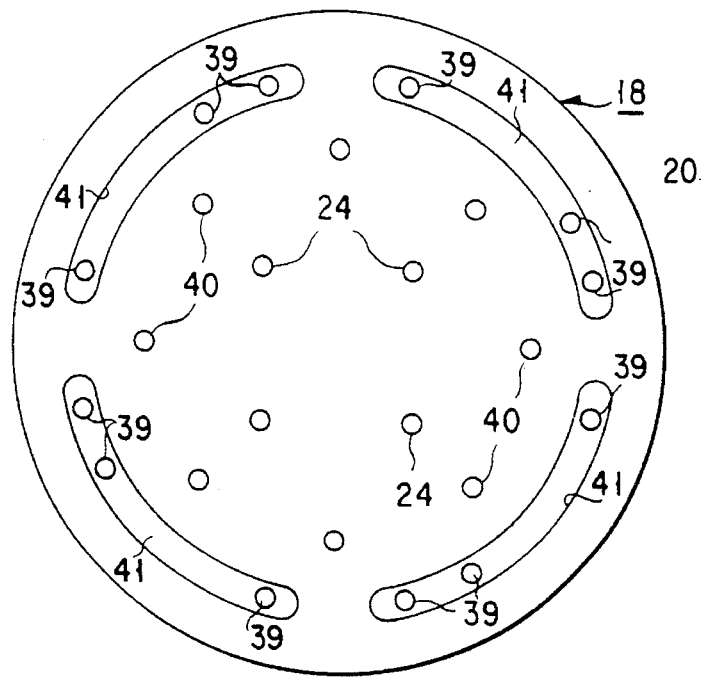
F I G. 7
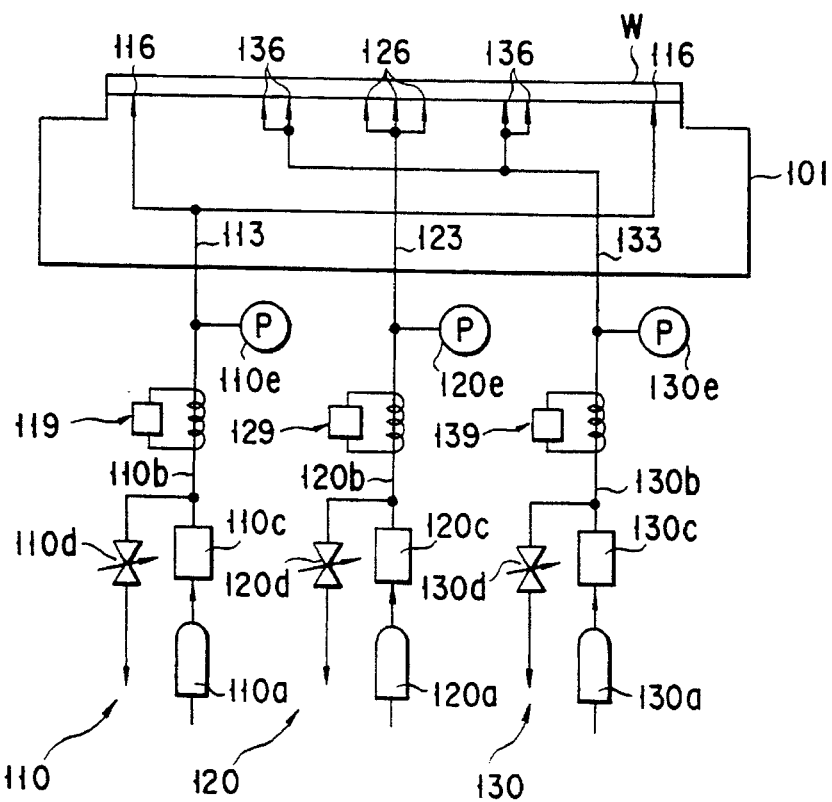
F I G. 16

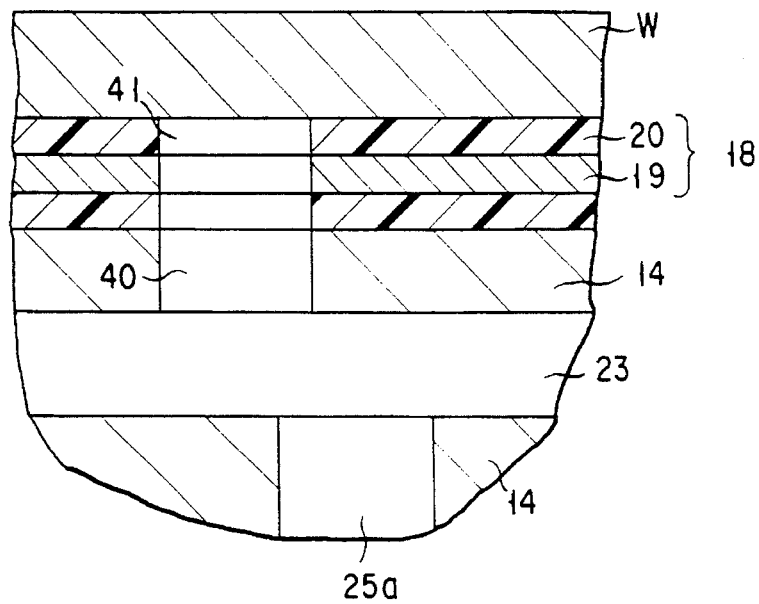
F I G. 8A
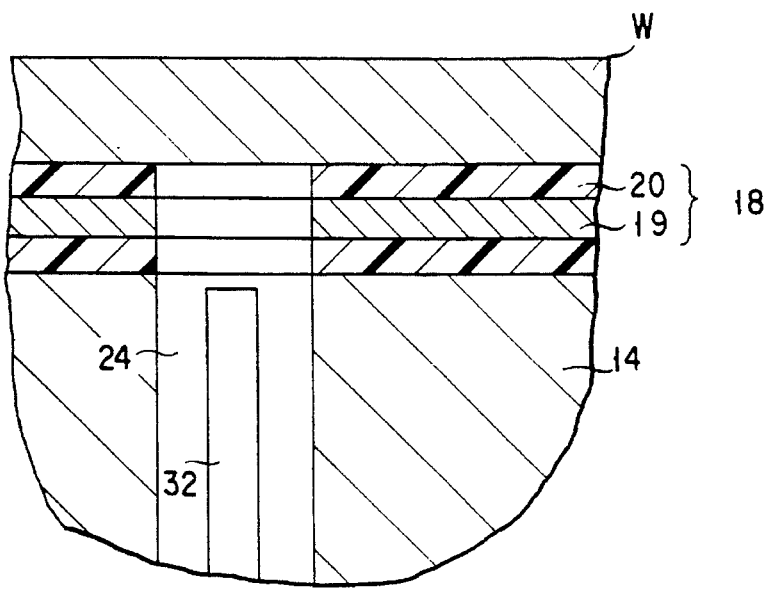
F I G. 8B

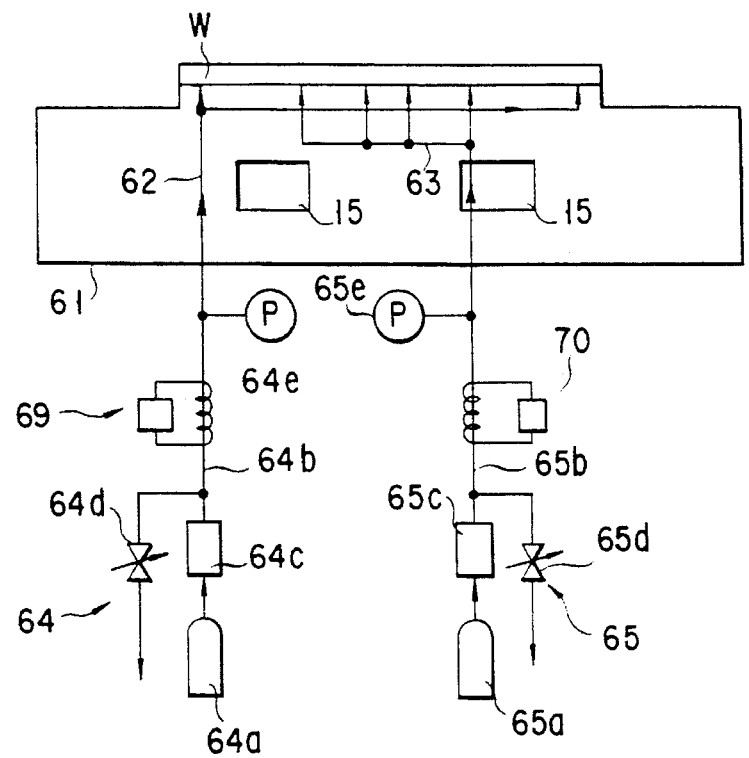
F I G. 12
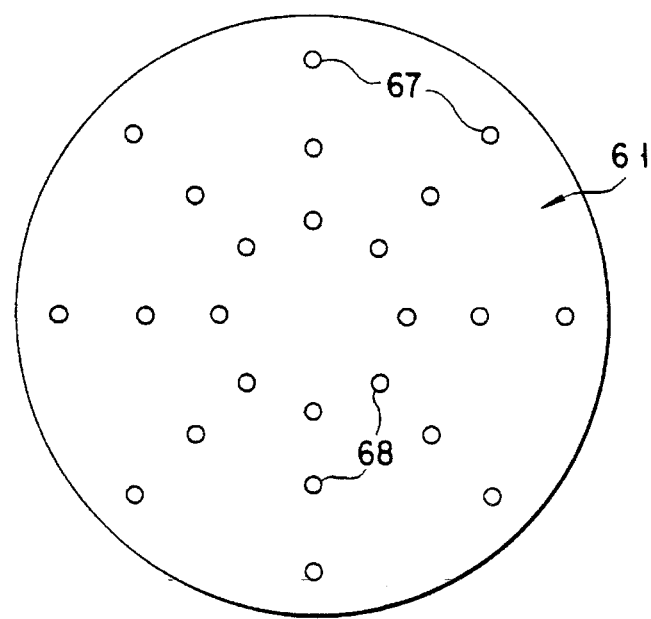
F I G. 13

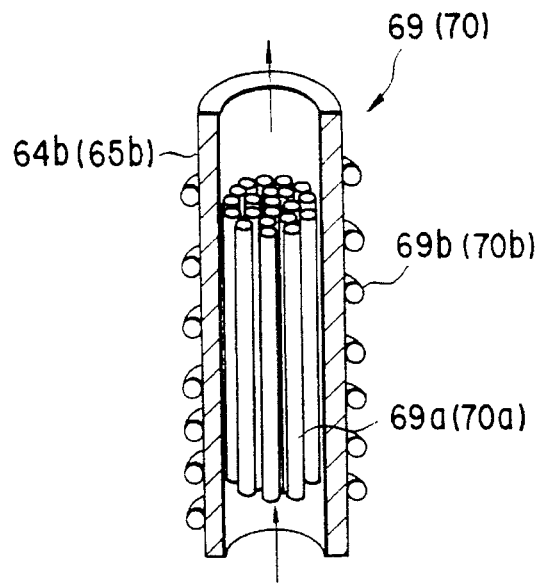
F I G. 14
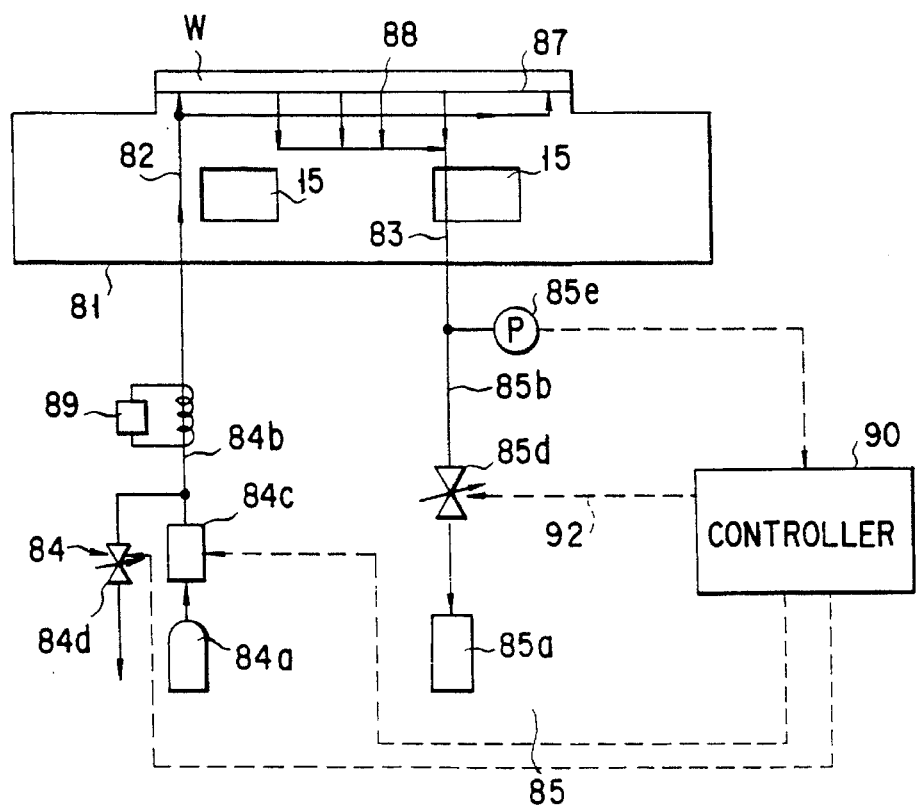
F I G. 15

PLASMA PROCESSING APPARATUS AND METHOD

This is a Continuation of application Ser. No. 08/361,579 filed on Dec. 22, 1994, U.S. Pat. No. 5,547,539.

BACKGROUND OF THE INVENTION

1. Field of the Invention

The present invention relates to plasma processing apparatus and method of processing substrates such as semiconductor wafers under plasma.

2. Description of the Related Art

Each circuit wiring in highly integrated semiconductor devices such as 16M and 64-MDRAM has had a half or quarter micron order diameter these days. The decompressed CVD, sputtering, etching, ashing apparatus and others are used in this super micro-process for circuit wirings. In the reactive ion etching (RIE) apparatus, for example, silicon dioxide ($SiO_2$) film 3 on a silicon wafer W is partly removed by anisotropic etching (or high aspect ratio etching) to form a contact hole 4 having vertical side wall 5 shown in FIG. 3.

During the anisotropic etching process, however, chemically-active radicals (or active species) are generated together with reactive ions in plasma. These active radicals react with $SiO_2$ to thereby cause $SiO_2$ film 3 to be isotropy-etched. As the result, the contact hole 4 has a bowing-shaped side wall 5 as shown in FIG. 1 or taper-shaped one 5 as shown in FIG. 2. To solve this problem, therefore, the wafer on a susceptor is cooled to be less influenced by plasma radiation heat. The generation of active radicals can be thus suppressed.

On the other hand, the wafer surface is needed to be as uniform as possible in temperature to attain a uniform etching rate during the etching process. It is difficult, however, to completely and tightly contact the wafer with the susceptor (or lower electrode) all over it, and the wafer is not fully cooled only by heat transmission attained between solid matters contacted each other. This incomplete cooling of the wafer is caused in the plasma CVD and ashing apparatus as well. In these apparatus, the process chamber is exhausted vacuum from several hundreds Torr to several mill Torr. The wafer is thus vacuum-insulated from the susceptor and heat exchange between them becomes incomplete. In order to solve this, therefore, gases are introduced into a clearance between them to develop heat exchange between them by heat exchange gases so as to quickly and uniformly cool the wafer.

As shown in FIG. 4, however, the center area of the wafer has a substantially uniform temperature distribution but the temperature distribution is not uniform at the peripheral area of the wafer. The peripheral area of the wafer is usually higher in temperature than the center area thereof. As shown in FIGS. 1 and 2, therefore, anisotropic etching is conducted at the edge area of the wafer to thereby provide contact holes each having a side wall not excellent in its verticality.

Further, the susceptor of the conventional apparatus has an outer diameter smaller than that of the wafer not to be damaged by plasma radiation heat. That area of the wafer which is projected outwards from the outer rim of the susceptor can be less cooled in this apparatus. This causes the etching rate not to be uniform in the whole area of the wafer.

SUMMARY OF THE INVENTION

The object of the present invention is therefore to provide plasma processing apparatus and method capable of making the temperature distribution uniform in the whole area of the substrate to be processed and applying a more uniform and better process to it.

According to the present invention, there can be provided a plasma processing apparatus for using heat exchange gas to increase the efficiency of cooling an object, which is to be processed, through a susceptor during plasma generation comprising a first passage opened in a top of the susceptor at a peripheral area thereof; first gas supply means for supplying heat exchange gas into a small clearance between the susceptor and the object through the first passage; first exhaust means for exhausting the small clearance through the first passage; a second passage opened in the top of the susceptor at a center area thereof; second gas supply means for supplying heat exchange gas into the small clearance through the second passage; second exhaust means for exhausting the small clearance through the second passage; and control means for controlling the first and second gas supply and exhaust means independently of the others in such a way that backpressure caused in the second passage by the second gas supply and exhaust means can become lower than backpressure caused in the first passage by the first gas supply and exhaust means.

According to the present invention, there can be provided a plasma processing method of using heat exchange gas to increase the efficiency of cooling an object, which is to be processed, through a susceptor during plasma generation comprising a step of introducing first and second heat exchange gases into a small clearance between the susceptor and the object through holes formed in a top of the susceptor at a peripheral area and an center area thereof, while exhausting the small clearance; and a step of making the backpressure of the first heat exchange gas higher than that of the second heat exchange gas.

The wafer which is being etched receives plasma radiation heat to thereby raise its surface temperature. Even if the susceptor is cooled to $-10°$ C., for example, its actual surface temperature arrives at $40°$–$50°$ C. when the backpressure of heat exchange gas is simply raised to increase cooling capacity in this case, temperature difference between at the peripheral area of the wafer and the center area thereof becomes to thereby make the etching not uniform. When back-gas is supplied under a certain pressure, it cannot be avoided that the peripheral area of the wafer becomes higher in temperature than the center area thereof.

The gas supply line to the center area of the wafer is therefore made different from the one to the peripheral area thereof, gas backpressure at the center area of the wafer is made lower than that at the peripheral area thereof, and heat exchange rate of gas at the center area of the wafer is intendedly made small. A temperature distribution shown in FIG. 5 can be obtained in this case. However, that relatively narrow area of the wafer which is adjacent to the center of the wafer has same temperature as that of the peripheral area thereof, but the middle area thereof has temperature lower than those at the other areas thereof. Particularly in the case of a large-sized wafer, temperature differences among the middle, edge and center areas of the wafer become quite large.

A gas supply line different from those to the other two areas of the wafer is therefore added to the middle area of the wafer and gas backpressure at the middle area thereof is also made lower than that at the peripheral area thereof. Substantially uniform temperature distributions shown in FIGS. 10 and 11 can be obtained in this case.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a vertically-sectioned view showing a contact hole obtained when temperature difference between a wafer and a susceptor is extremely large in anisotropic etching;

FIG. 2 is a vertically-sectioned view showing a contact hole obtained when temperature difference between the wafer and the susceptor is fairly large in anisotropic etching;

FIG. 3 is a vertically-sectioned view showing a contact hole obtained when temperature difference between the wafer and the susceptor is extremely small;

FIG. 4 is a temperature distribution showing temperatures at some intended portions of the wafer obtained when the wafer is cooled by a conventional apparatus;

FIG. 5 is a temperature distribution showing temperature at some intended portions of the wafer obtained when the wafer is cooled by a comparison apparatus;

FIG. 7 as a plan view showing a susceptor (or lower electrode) viewed from above;

FIGS. 8A and 8B are sectional views showing parts of the susceptor sectioned;

FIG. 12 is a sectional view showing a susceptor and a back-gas supply system in a second plasma processing apparatus;

FIG. 13 is a plan view showing the susceptor in the second plasma processing apparatus viewed above;

FIG. 14 is a perspective view showing a pipe dismantled, said pipe serving as a part of a temperature adjuster mechanism;

FIG. 15 is a sectional view showing a susceptor and a back-gas supply system in a third plasma processing apparatus; and FIG. 16 is a sectional view showing a susceptor and a back-gas supply system in a fourth plasma processing apparatus.

DETAILED DESCRIPTION OF THE PREFERRED EMBODIMENTS

Figure 6:
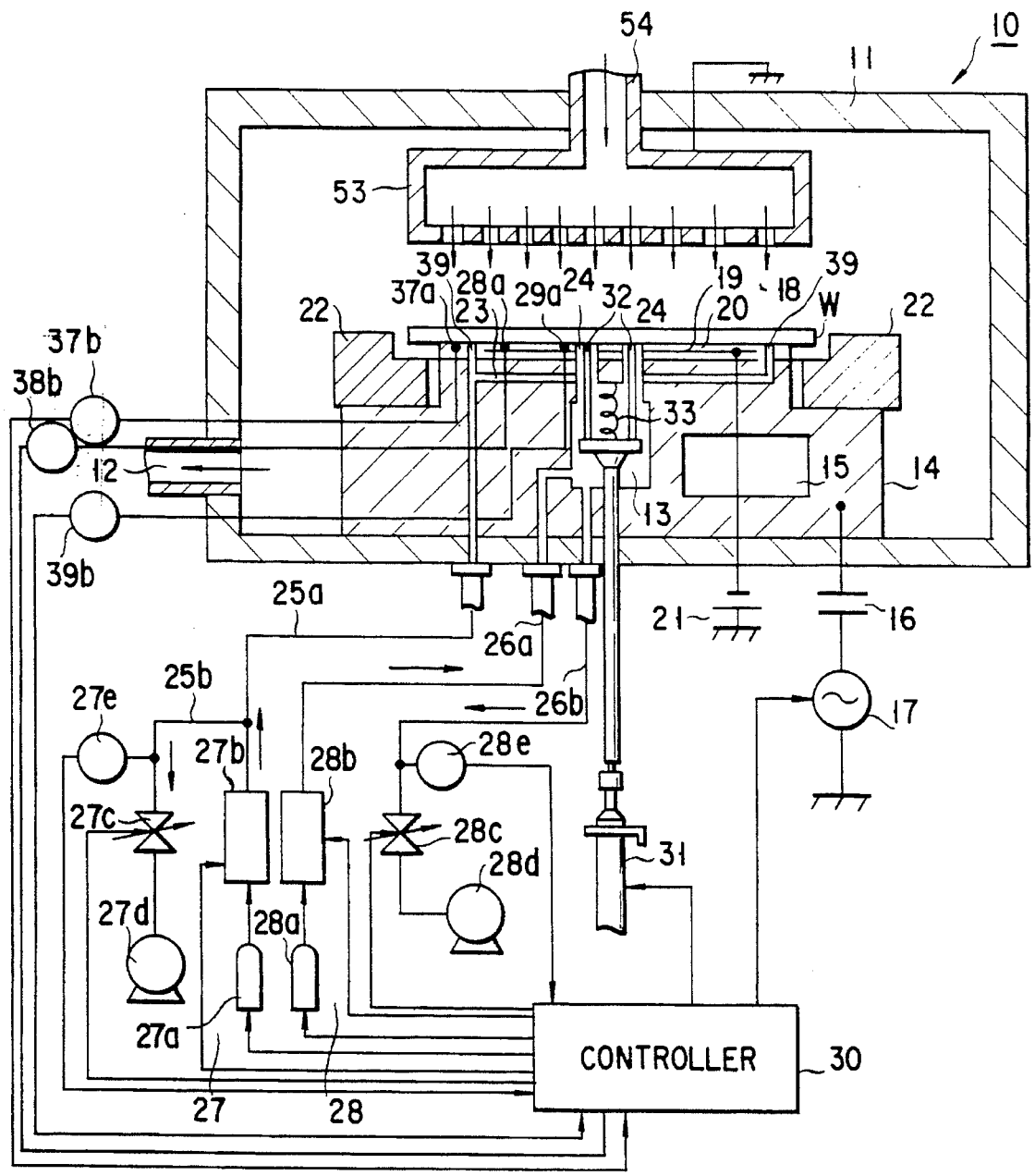
FIG. 6 is a sectional and perspective view showing the whole of the plasma processing apparatus according to a first embodiment of the present invention.

Some embodiments of the present invention will be described with reference to the accompanying drawings. A case where the present invention is applied to the plasma etching apparatus will be described as a first embodiment of the present invention, referring to FIGS. 6 through 11.

An apparatus 10 according to first embodiment of the present invention serves as a reactive ion etching (RIE) one provided with upper (shower) electrode 53 and lower (susceptor) electrode 14. It has a process chamber 11 made of conductive material such as aluminium and shaped like cylinder or tube. The process chamber 11 is made air-tight and has an exhaust pipe 12 at the lower portion thereof and a process gas supply pipe 54 at the top thereof. The exhaust pipe 12 is communicated with the pump-up side of a vacuum pump (not shown), by which pressure in the process chamber 11 can be reduced to a high vacuum lower than $10^{-2}$ Torr, for example. The susceptor (or lower electrode) 14 is arranged on the bottom of the process chamber 11 and its body is made of aluminium alloy. An electrostatic chuck 18 is bonded on the top of the susceptor 14 and wafer W can be attracted and held on the susceptor 14 by the electrostatic chuck 18. The upper portion of the susceptor 14 has a diameter smaller than that of the wafer W.

A coolant passage 15 through which coolant such as liquid nitrogen flows is formed in the susceptor 14. Further, a high frequency power source 17 is connected to the susceptor 14 via a blocking capacitor 16 to add a high frequency voltage of 13.56 MHz to the susceptor 14.

The electrostatic chuck 18 is bonded to the upper portion of the susceptor 14 by adhesive and it has an outer diameter same as that of the upper portion of the susceptor 14. Its conductive metal film 19 is interposed between insulator films 20. The conductive metal film 19 is a copper foil and each insulator film 20 a resin one of the polyimide group. A DC power source 21 is connected to the conductive metal film 19.

A space 13 is formed an the susceptor 14 and four pins 32 are arranged in the space 13, which is opened in the top of the susceptor 14 through four vertical passages 24. The pins 32 are supported by a cylinder unit 31 to move up and down through their passages 24 in the susceptor 14. The drive swatch of the cylinder unit 31 is connected to the output side of a controller 30. When the pins 32 are moved up, the wafer a is lifted above from the susceptor 14.

A focus ring 22 made of quartz is arranged round the susceptor 14 to draw plasma generated to the semiconductor wafer W.

The upper electrode 53 is opposed to the lower one 14 with an interval of 15–20 mm interposed between them. The supply pipe 54 attached to the center top of the upper electrode 53 is connected to an etching gas supply source (not shown), passing through the center top of the process chamber 11. A plurality of gas holes 15 are formed all over the bottom of the upper electrode 53, which is grounded to maintain ground potential.

Gas lines 25a and 25b are communicated with a first gas supply unit 27 while gas lines 26a and 26b with a second gas supply unit 28. The first gas supply unit 27 includes a gas supply source 27a, a mass flow controller (MFC) 27b, a variable valve 27c, a vacuum pump 27d and a pressure sensor 27e. The second gas supply unit 28 includes a gas supply source 28a, an MFC 28b, a variable valve 28c, a vacuum pump 28d and a pressure sensor 28e. The gas supply sources 27a, 28a, MFCs 27b, 28b, variable valves 27c, 28c and vacuum pumps 27d, 28d are connected to the output side of the controller 30.

Helium gas is stored in the gas supply sources 27a and 28a. Inactive gas such as neon, argon or xenon and reactive gas such as nitrogen and hydrogen gases or nitrogen and oxygen gases can be used as heat transmitting or conductive gas in addition to helium gas. Particularly when reactive gas is used, it is preferable that reactive gas supplied from the first gas supply unit 27 is made different from one supplied from the second gas supply unit 28 to achieve their respective endothermic reactions in a clearance between the semiconductor wafer W and the susceptor 14. This is because not only heat transmission rate but also cooling efficiency can be raised by their endothermic reactions. When reactive gas is used as heat transmitting one, however, it must be selected not to cause itself and gases produced from it to add any influence to the plasma process.

The gas passage 25a is communicated with the first gas supply source 27a via the MFC 27b, the gas passage 25b with the first vacuum pump 27d via the variable valve 27c, the gas passage 26a with the second gas supply source 28a via the MFC 28b, and the gas passage 26b with the second vacuum pump 28d via the variable valve 28c. The internal passages 25a, 26a and 26b are arranged independent of the others in the susceptor 14 not to interfere with one another and with the coolant passage 15.

Three temperature sensors 37a, 38a and 39a are embedded in the susceptor 14. The first temperature sensor 37a is located just under the edge portion of the wafer a, the second one 38a just under the middle portion thereof, and the third one 38a just under the center portion thereof. They are connected to the output side of the controller 30 via detectors 37b, 38b and 39b, respectively.

As shown in FIGS. 7 and 8A, four arc grooves 41 are formed in the electrostatic chuck 18 along the peripheral portion thereof. Three through-holes 39 are opened at the bottom of each groove 41. The internal passage 25a is communicated with a horizontal passage 23 in the susceptor 14 and further with the through-hole 39 in the electrostatic chuck 18. The copper foil 19 of the electrostatic chuck 18 is 10–100 μm thick and each polyimide film is 10–100 μm thick.

As shown in FIGS. 7 and 8B. four passages 24 are opened in the center area or portion of the electrostatic chuck 18 and eight passages 40 in the middle area thereof. It is preferable that each of the passages 24, 39 and 40 has a diameter of 0.1–2.0 mm, more preferably 0.5–1.2 mm. It is also preferable that the number of passages opened an the electrostatic chuck 18 is made as large as possible, and more preferably 8–200 of them in the case of 6- and 8-inch wafers. It is preferable that they are arranged concentric with one another in each group. Further, it is preferable that each of them in the center area group is separated from each of them in the middle area group by 50 mm or less and that each of them in the middle area group from each of them in the peripheral area group by 50 mm or less, too. This is because heat exchanging effect attained by back gases is reduced and because the middle area of the wafer W is too much cooled (over-cooled), as compared with the other areas thereof, when their interval is made larger than 50 mm.

Figure 9:
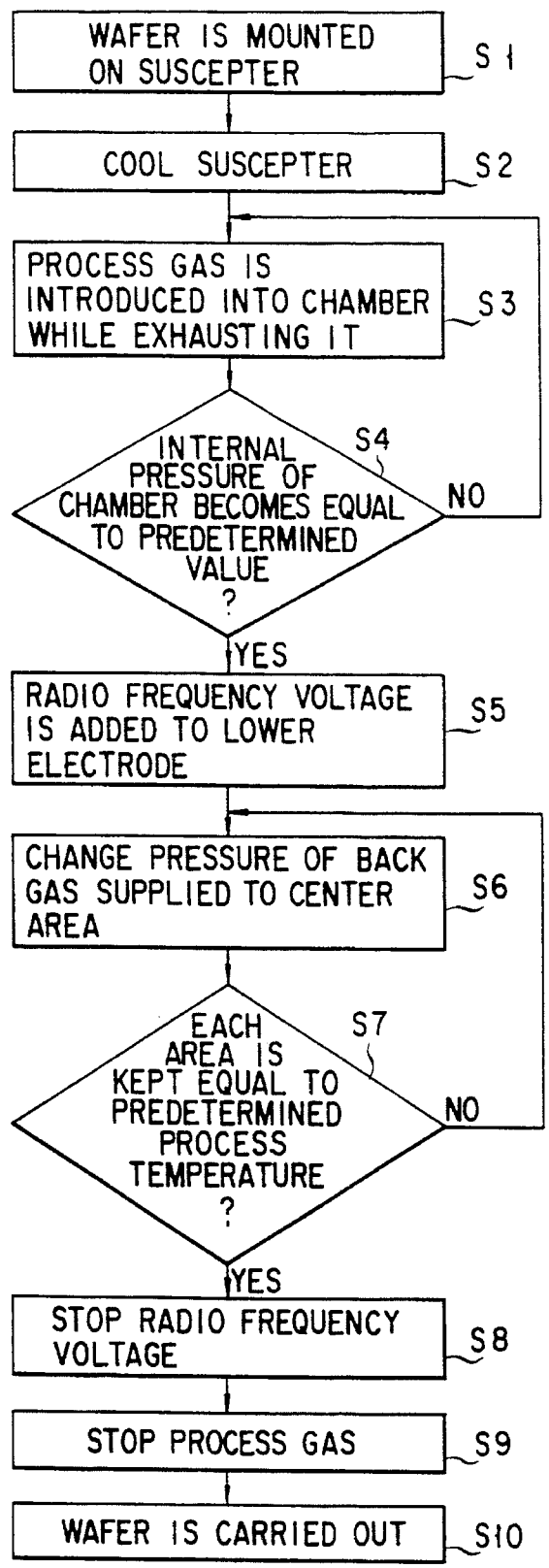
FIG. 9 is a flow chart showing how the wafer is etched.

Referring to FIG. 9, it will be described how the wafer W is processed by the above-described apparatus.

A wafer W as carried into the process chamber 11 which has been made vacuum. Internal Pressure of the process chamber 11 is set at this time to be in a range of from several Torr. to 100 Torr. The 8-inch wafer W is mounted on the susceptor 14 and attracted and held there by the electrostatic chuck 18 (Step S1). The susceptor 14 is cooled while supplying liquid nitrogen into the coolant passage 15 (Step S2). It is cooled to a predetermined temperature of −10° C., for example.

Etching gases are supplied into the chamber 11 through the upper electrode 53, while exhausting the chamber 11 vacuum, and pressure in the chamber 11 is controlled to be stable and lower than $10^{-2}$ Torr (Step S3). The composition of etching gases is as follows.

$CHF_3$ gas - - - 30 SCCM
$CF_4$ gas - - - 30 SCCM
Ar gas - - - 600 SCCM

It is confirmed whether or not internal pressure of the chamber 11 becomes equal to $10^{-2}$ Torr or less (Step S4). When it becomes equal to this value, high frequency voltage of 13.56 MHz is added to the lower electrode 14 to generate plasma in the chamber 11 (Step S5).

While receiving radiation heat from plasma generated, the wafer W raises its surface temperature to 40°–100° C. higher than room temperature. Both of back-gases supplied and exhausted are balanced while supplying them to each area of the underside of the wafer W and exhausting them from there. Supply and exhaust of back-gases are adjusted and balanced to make gas backpressure at the edge area of the wafer W stable in a range of 10–25 Torr. On the other hand, gas backpressures at the middle and center areas of the wafer a are fluctuated (Step S6). Gas pressures at the middle and center areas of the wafer W are fluctuated in a range lower than the certain gas backpressure at the edge area thereof. It is desirable that gas backpressure at each area is controlled under the following conditions.

| Area | Wafer peripheral Area | Wafer Middle and Center Areas |
|---|---|---|
| Gas Back-pressure | 30 Torr (Certain) | 7.5–12.5 Torr (Variable) |
| | 25 Torr (Certain) | 7.5–12.5 Torr (Variable) |
| | 20 Torr (Certain) | 5.0–10.0 Torr (Variable) |
| | 15 Torr (Certain) | 5.0–10.0 Torr (Variable) |
| | 10 Torr (Certain) | 5.0–7.5 Torr (Variable) |

Figure 10:
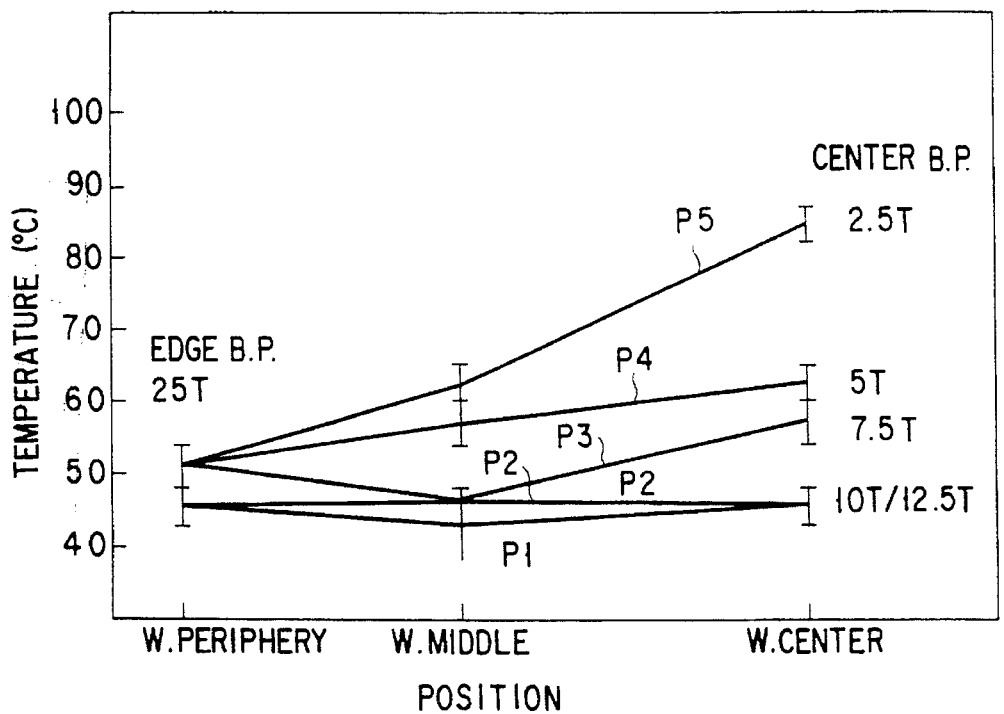
FIG. 10 is a temperature distribution showing temperatures at some intended portions of the wafer obtained when the wafer is cooled by the first plasma processing apparatus.
Figure 11:
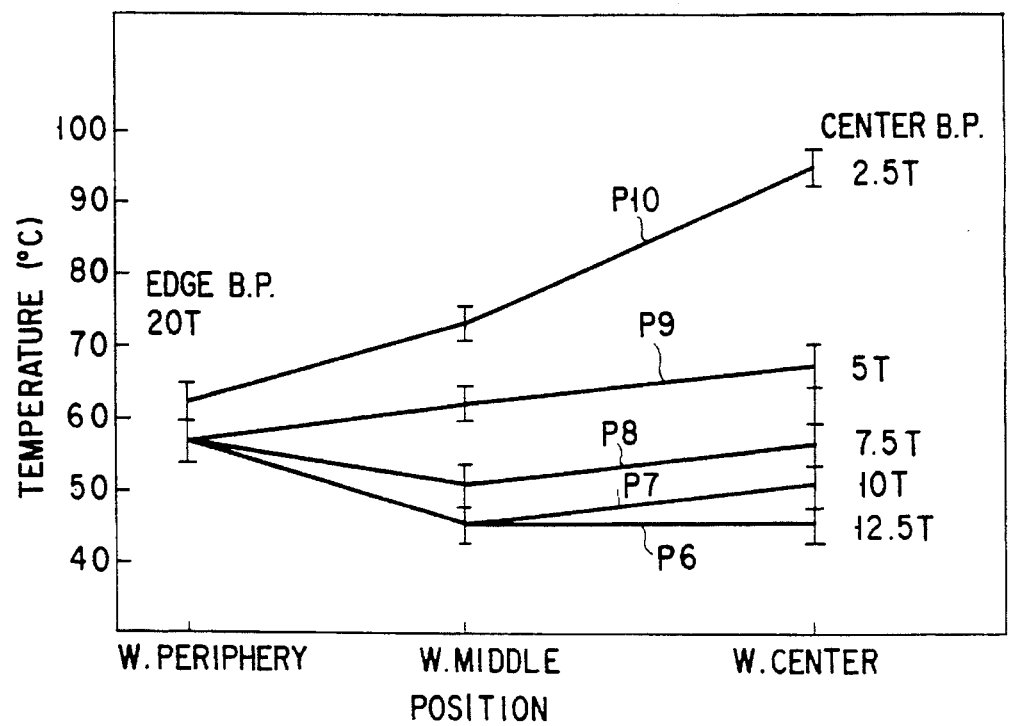
FIG. 11 is a temperature distribution showing temperatures at some intended portions of the wafer obtained when the wafer is cooled by the first plasma processing apparatus.

FIGS. 10 and 11 are temperature distribution diagrams showing temperatures at the peripheral, middle and center areas of the wafer W obtained while changing gas backpressure at each area. In FIGS. 10 and 11, positions at which temperature is detected are plotted on the horizontal axis and temperatures detected on the vertical axis. Pressure in the chamber 11 was 300 mTorr, high frequency power added was 1300 W, the interval between the wafer and the upper electrode was 1 cm, electrostatic chuck holding current was 1.5 KV, susceptor temperature was −10° C., temperature of the upper electrode was 20° C., temperature of chamber inner wall was 40° C., and the time during which RF power is added was 2 minutes. Temperature detecting position at the peripheral area of the wafer was 10 mm distant from the edge of the wafer.

In FIG. 10, gas backpressure at the peripheral area of the wafer W was set certain or 25 Torr. A temperature distribution curve $P_1$ was obtained when gas back-pressure at the wafer center area was set 12.5 Torr, a curve $P_2$ when it was set 10 Torr, a curve $P_3$ when it was set 7.5 Torr, a curve $P_4$ when it was set 5 Torr, and a curve $P_5$ when it was set 2.5 Torr.

In FIG. 11, gas backpressure at the wafer peripheral area was set certain or 20 Torr. A temperature distribution curve $P_6$ was obtained when gas back-pressure at the wafer center area was set 12.5 Torr, a curve $P_7$ when it was set 10 Torr, a curve $P_8$ when it was set 7.5 Torr, a curve $P_9$ when it was set 5 Torr, and curve $P_{10}$ when it was set 2.5 Torr.

As apparent from FIGS. 10 and 11, gas back-pressure at wafer center area is optimum in a range of 7.5–12.5 Torr (variable) when gas backpressure at the wafer peripheral area is set 25 Torr (certain). When gas backpressure at the wafer edge area is set 20 Torr (or certain), gas backpressure at the wafer center area is optimum in a range of 5.0–10.0 Torr (variable).

When gas backpressure is controlled in this manner, temperature at the wafer peripheral area becomes equal to room temperature (20°–30° C.) and those at the middle and center areas becomes equal to it, too. Heat exchange rates of gas at the wafer middle and center areas become smaller at this time than that at the wafer peripheral area. The overcooling of the wafer middle and center areas can be thus suppressed. In addition, that portion of the wafer peripheral area which is projected outward from the outer rim of the electro-static chuck 18 is more strongly cooled. It results, therefore, that the whole of the wafer is cooled at better balance.

Temperatures at wafer areas are detected by temperature sensors 37a, 38a and 39a and it is confirmed whether or not each wafer area is kept at a predetermined process temperature (Step S7). When answer is "No", back-gas pressures at the wafer middle and center areas are further fluctuated. When answer is "Yes", the supply of high frequency voltage to the susceptor 14 is stopped after the lapse of a certain time since the generation of plasma (Step S8). Further, the supply of process gases is stopped (Step S9). Current supply to the electrostatic chuck 18 is then stopped and the wafer a is pushed up by the pins 32 and carried out of the chamber 11 (Step S10). As the result, silicon oxide film 3 on the wafer W is uniformly anisotropy-etched and a contact hole 4 having a vertical side wall 5 is formed (or high aspect ratio etching), as shown in FIG. 3.

When the wafer surface is anisotropy-etched at a temperature range (40°–100° C.) higher than room temperature, the contact hole 4 formed has a bowing- or taper-shaped side wall 5.

Reactive gases such as nitrogen and oxygen gases which react each other may be supplied, instead of helium gas, through the first and second supply and exhaust means 27 and 28. When these gases are used, they cause endothermic reaction just under the wafer W and take heat from the wafer W. The wafer W can be thus cooled for a shorter time period to thereby achieve a higher throughput.

A second embodiment of the present invention will be described. referring to FIGS. 12 through 14. Same components as those of the first embodiment will be described only when needed.

Heat exchanging gas supply and exhaust units 64 and 65 in this case are different from those in the first embodiment. First gas passage 62 and second gas passage 63 are formed in a susceptor 61.

As shown in FIG. 13, first and second gas passages 62 and 63 branch in the susceptor 61 and they are opened in the top of the susceptor 61 at plural points. They are communicated with pipes 64b and 65b of first and second gas supply and exhaust units 64 and 65. The first gas supply and exhaust unit 64 includes a helium gas supply source 64a, a mass flow controller 64c, a temperature adjuster 69, a pressure gauge 64e and an exhaust line variable valve 64d. The second gas supply and exhaust unit 65 includes a helium gas supply source 65a, a mass flow controller 65c, a temperature adjuster 70, a pressure gauge 65e and an exhaust line variable valve 65d. pipes 64b and 65b are made of nickel alloy such as stainless steel and inconel.

Mixed gas including process gases, argon gas, nitrogen gas or carbon dioxide gas may be used, instead of helium gas, as heat exchanging gas supplied from gas supply sources 64a and 65a. Mixed gas of nitrogen and oxygen gases or nitrogen and hydrogen gases by which endothermic reaction is caused may be used as heat exchanging gas. Or mixed gas of hydrogen and oxygen gases or carbon oxide and oxygen gases by which exothermic reaction is caused may be used as heat exchanging gas.

As shown in FIG. 13, first holes 67 numbering eight are formed in the susceptor 61 along the peripheral thereof and they are communicated with the first gas passage 62. Second holes 68 numbering sixteen are formed in the susceptor 61 at the middle and center areas thereof and they are communicated with the second gas passage 63. Eight first holes 67 (at the wafer peripheral area), eight second holes 68 (at the wafer middle area) and eight second holes 68 (at the wafer center area) are arranged concentric with one another. Each of first holes 67 is about 10 mm distant from the edge of the wafer. It is preferable that each of first and second holes 67 and 68 has a diameter of from 0.1 mm to 2.0 mm. it is desirable that the number of these holes is as large as possible, preferably in a range of from eight to two hundreds.

It will be described how the susceptor 61 is made.

A temperature detecting sheet is attached on the surface of the wafer and the wafer W is then mounted on the susceptor 61 and attracted and held there by the electrostatic chuck. The temperature detecting sheet includes heat sensitive color elements therein which display colors responsive to temperatures, and it is shaped like a band or disk. When colors displayed on the temperature detecting sheet are checked, the temperature distribution of the wafer W can be confirmed. While repeating this color checking several times, it is found how the wafer W is cooled by the susceptor 61. The number of holes 67 and 68 is made large at these areas of the susceptor 61 where good heat exchange is not attained between the wafer W and the susceptor 61, while it is made small at those areas of the susceptor 61 where good heat exchange is attained between them.

As shown in FIG. 14, the first temperature adjuster 69 includes temperature adjuster members 69a, a coil 69b and a temperature controller (not shown). The temperature adjuster members 69a are a plurality of capillary tubes bundled up, and they are arranged in the pipe 64b. The coil 69b is wound round the pipe 64b, enclosing the temperature adjuster members 69a. The temperature controller is intended to adjust the temperature of temperature adjuster members 69a through the coil 69b.

When helium gas is to be cooled, the coil 69b serves as a cooling coil through which coolant is circulated. Silicon grease is arranged, as heat exchanging medium, between the cooling coil 69b and the pipe 64b.

A porous material may be used, instead of the bundled capillary tubes shown in FIG. 14, as temperature adjuster members 69a. it is preferable that the temperature adjuster members 69a are made of material, corrosion proof and resistant against causing particles, such as same material of which the pipe 64b is made, or quartz.

It will be described how the second apparatus is operated.

Helium gas whose flow rate is controlled by the mass flow controller 64c is supplied into the first passage 62, while helium gas whose flow rate is controlled by the mass flow controller 65c into the second passage 63. Pressures under which these gases are supplied are kept certain by the variable valves 64d, 65d and the pressure gauges 64e, 65e. Gases are continuously supplied into the clearance between the suscepter 61 and the wafer W through first and second holes 67 and 68. Gas which enters into the first passage 62 is adjusted 15° C. in temperature by the first temperature adjuster 69, while gas which enters into the second passage 63 is adjusted 37° C. by the second temperature adjuster 70. The whole of the wafer W is set about 5° C. by gases supplied through first and second holes 67 and 68.

Keeping a monitor wafer MW mounted on the susceptor 61, gas whose flow rate is certain is supplied from the first gas supply means 64 into the first gas passage 62. Gas whose flow rate is certain is also supplied from the second gas supply means 65 into the second gas passage 63 at the same time.

When the monitor wafer MW is not uniformly cooled, gas flow razes are adjusted independently of the other by the mass flow controllers 64c and 65c or gas temperatures are adjusted by the first and second temperature adjusters 69 and 70 to find gas flow rates or temperatures at which the whole of the monitor wafer MW can have a temperature of about 5° C., while monitoring the temperature distribution of the monitor wafer MW by the infrared rays temperature sensors.

When temperature difference between high and low temperature areas of the monitor wafer MW is large, gas pressure is increased by the variable valve 64d or 65d to make heat exchanging rate high. Or inactive gas such as neon gas having a large enthalpy is used to increase heat transmission capacity. Or gas temperatures are adjusted by the first and second temperature adjusters 69 and 70. As a result, the whole of the monitor wafer MW is thus made uniform in temperature for a short time.

When the whole of the monitor wafer MW as uniform in temperature, gas flow rates and temperatures obtained at this time after their being adjusted are set and stored in a memory of the control unit.

When etching process is to be carried out, mixed gas of trifluoroethane ($CHF_3$) and carbon oxide (CO) having a mixing rate of $CHF_3/CO=45/155$ is supplied into the process chamber at a flow rate of 200 SCCM and etching gas pressure is set $4 \times 10^{-2}$ Torr, for example. High frequency power of 13.56 MHz and 1450 W is then added to the suscepter 61 and discharge is caused between the suscepter 61 and the upper electrode 53 through etching gas to generate plasma between them. The wafer a is thus anisotropy-etched mainly by reactive ions in plasma. Wafer temperature is raised by plasma radiation heat but this temperature rising of the wafer W is suppressed because the wafer a is cooled by the suscepter 61.

According to the above-described second embodiment of the present invention, gas is supplied to that peripheral area of the wafer a, whose temperature is higher than 5° C., at a large flow rate to make gas backpressure high and to lower the temperature of this area to 5° C. On the other hand, gas is supplied to those middle and center areas of the wafer a, whose temperatures are lower than 5° C., at a small flow rate to make gas backpressure low and to raise temperatures of these areas to 5° C. The whole of the wafer a can be thus made uniform, in temperature.

According to the second embodiment, temperatures of gases supplied are adjusted by the first and second temperature adjusters 69 and 70, if necessary, to thereby make the whole of the wafer W uniform to 5° C. in temperature.

A third embodiment of the present invention will be described referring to FIG. 15. Same components as those of the first and second embodiments will be described only when needed.

In the third etching apparatus, gas is supplied through a passage 82, which is opened at the peripheral area of a suscepter 81, while gas thus supplied is exhausted through a passage 83, which is opened at the middle and center areas of the wafer W. The supply passage 82 is communicated with a gas supply source 84a of gas supply means 84 and the exhaust passage 83 with an exhaust unit 85a of gas exhaust means 85.

The gas exhaust means 85 has a control unit 90. A pressure gauge 85e is connected to the input side of the control unit 90 and variable valves 84d, 85d and a mass flow controller 84c are connected to the output side of the control unit 90.

It will be described how the third apparatus is operated.

The temperature of gas supplied is adjusted by a temperature adjuster S9 and it is set using a monitor wafer MW. Gas whose flow rate is certain is supplied from the gas supply means 84 into the passage 82 and then to the underside of the monitor wafer MW through plural holes 87 in the top of the suscepter 81. At the same time, it is exhausted through exhaust holes 88. A flow of gas flowing from the peripheral area of the monitor wafer MW to the center area thereof is thus formed. The backpressure of back gas is detected by the pressure gauge 85e and a signal thus detected is sent to the control unit 90 to control the mass flow controller 84c to make the gas flow rate optimum. The temperature of the monitor wafer MW is adjusted by gas whose flow rate has been adjusted as described above. The variable valves 84d and 85d arc also adjusted, if necessary, to adjust the gas backpressure. Gas temperature and others obtained at this time are set and stored in a memory of the control unit 90. The whole of the monitor wafer MW is made substantially uniform in temperature in this manner and the intended etching process is then started.

According to the above-described third apparatus, the temperature of the monitor wafer MW can be positively adjusted by heat exchanging gas, even if the monitor wafer MW has any undesirable temperature distribution, so that the whole of the monitor wafer MW can be made uniform in temperature.

Further, the pressure of back-gas is detected by the pressure gauge 85e of the exhaust line. This enables pressure in the clearance between the monitor wafer MW and the suscepter 81 to be more accurately detected, as compared with a case where the pressure gauge is attached to the supply line.

A fourth embodiment of the present invention will be described referring to FIG. 16. Same components as those of the first through third embodiments will be described also in this case only when needed.

The fourth apparatus has a suscepter 101 for 12-inch wafers W. The suscepter 101 has a plurality of holes 116, 126 and 136 in the top thereof because it has a large top area. Opens 116 are formed in the peripheral area of the susceptor 101, opens 126 in the center area of it, and opens 136 in the middle area of it. The first group opens 116 are communicated with a first gas supply and exhaust unit 110 via an internal passage 113, the second group opens 126 with a second gas supply and exhaust unit 120 via an internal passage 123, and the third group opens 136 with a third gas supply and exhaust unit 130 via an internal passage 133. Each of these three lines gas supply and exhaust units 110, 120 and 130 is same as that of the above-described second embodiment.

According to the fourth apparatus, three lines gas supply and exhaust units 110, 120 and 130 can be controlled independently of the others to more accurately control the backpressure of heat exchange gas in each area of the wafer W. Even if the wafer W has a large area like the 12-inch one, therefore, its temperature can be controlled to provide a temperature distribution whose temperature difference is quite small all over the wafer W. Anisotropic etching can be thus realized to form contact holes each having an excellent vertical side wall.

Although the present invention has been applied to the etching apparatus in the above-described cases, it can be also applied to the plasma CVD and ashing apparatus and others.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A plasma processing apparatus using a heat exchange gas to increase the cooling efficiency of a substrate to be processed through a suscepter during plasma generation, comprising:

a first passage open at a peripheral portion in a top of said suscepter;

first gas supply means for supplying a heat exchange gas through said first passage into a small clearance formed between the suscepter and said substrate to be processed;

a first temperature control mechanism for controlling the temperature of the heat exchange gas supplied from said first gas supply means into the first passage;

first exhaust means for exhausting the small clearance formed between the suscepter and the substrate through the first passage;

a second passage open in a central portion in the top of the suscepter;

second gas supply means for supplying a heat exchange gas into the small clearance formed between the suscepter and the substrate through said second passage;

a second temperature control mechanism for controlling the temperature of the heat exchange gas supplied from said second gas supply means into said second passage; and second exhausting means for exhausting the small clearance formed between the suscepter and the substrate through the second passage.

2. The plasma processing apparatus according to claim 1, wherein each of said first and second temperature control mechanisms comprises:

a temperature control member mounted within a pipe through which the heat exchange gas is supplied; and heat exchange means arranged within a pipe for supplying the heat exchange gas such that heat is exchanged between said heat exchange means and said heat exchange gas circulated through said pipe.

3. The plasma processing apparatus according to claim 2, further comprising:

temperature control means for controlling the temperature of the heat exchange means;

a temperature sensor for detecting a temperature of said suscepter; and control means for controlling the first and second gas supply means, the first and second exhausting means, and the temperature control means based on the temperature detected by the temperature sensor.

4. The plasma processing apparatus according to claim 2, wherein said temperature control member has a surface area which is sufficiently large compared with the volume thereof and is adapted for achieving heat exchange.

5. The plasma processing apparatus according to claim 4, wherein said temperature control member is formed of a porous material.

6. The plasma processing apparatus according to claim 4, wherein said temperature control member consists of a bundle of capillary tubes.

7. The plasma processing apparatus according to claim 6, wherein said capillary tube is formed of quartz.

8. The plasma processing apparatus according to claim 6, wherein said capillary tube is made of a metallic material.

9. The plasma processing apparatus according to claim 2, wherein a heat exchange medium is interposed between said heat exchange means and said pipe.

10. The plasma processing apparatus according to claim 1, further comprising control means for independently controlling said first and second gas supply means and said first and second exhaust means such that the backpressure generated within the second passage by the second gas supply means and the second exhaust means is lower than the backpressure generated within the first passage by the first gas supply means and the first exhaust means.

11. The plasma processing apparatus according to claim 1, wherein each of said first and second passages is open at a plurality of portions at the top of the suscepter to form a first group of openings positioned to form a circular arrangement and a second group of openings positioned to form a circular arrangement concentric with said circular arrangement formed by said first group of openings.

12. The plasma processing apparatus according to claim 1, further comprising:

a third passage open at an intermediate portion between the center and the periphery in the top of the suscepter;

third gas supply means for supplying a heat exchange gas into a small clearance formed between the suscepter and the substrate to be processed through said third passage; and third exhaust means for exhausting the small clearance formed between the suscepter and said substrate through said third passage.

13. A plasma processing apparatus using a heat exchange gas to increase the cooling efficiency of a substrate to be processed through a suscepter during plasma generation comprising:

a first passage open at a peripheral portion in a top of said suscepter;

gas supply means for supplying a heat exchange gas through said first passage into a small clearance formed between the suscepter and said substrate to be processed;

a temperature control mechanism for controlling the temperature of the heat exchange gas supplied from said gas supply means into the first passage;

a second passage open in a central portion in the top of the suscepter; and exhausting means for exhausting the small clearance formed between the suscepter and the substrate through the second passage.

14. The plasma processing apparatus according to claim 13, wherein said temperature control mechanism comprises:

a temperature control member mounted within a pipe through which the heat exchange gas is supplied; and heat exchange means arranged within a pipe for supplying a heat exchange gas such that heat is exchanged between said heat exchange means and said heat exchange gas circulated through said pipe.

15. A plasma processing apparatus using a heat exchange gas to increase the cooling efficiency of a substrate to be processed through a suscepter during plasma generation, comprising:

a passage open at a top of said suscepter;

gas supply means for supplying a heat exchange gas through said passage into a small clearance formed between the suscepter and the substrate to be processed; and a temperature control mechanism for controlling a temperature of the heat exchange gas supplied from said gas supply means into said passage.

16. The plasma processing apparatus according to claim 15, wherein said temperature control mechanism comprises:

a temperature control member mounted within a pipe through which the heat exchange gas is supplied; and heat exchange means arranged within a pipe for supplying a heat exchange gas such that heat is exchanged between said heat exchange means and said heat exchange gas circulated through said pipe.

17. The plasma processing apparatus according to claim 15, further comprising:

temperature control means for controlling the temperature of the heat exchange means;

a temperature sensor for detecting the temperature of said suscepter; and control means for controlling the first and second gas supply means, the first and second exhausting means, and the temperature control means based on the temperature detected by the temperature sensor.

18. A plasma processing apparatus using a heat exchange gas to increase the cooling efficiency of a substrate to be processed through a suscepter during plasma generation, comprising:

a passage open at a top of said suscepter;

first and second gas supply means for supplying a heat exchange gas through said passage into a small clearance formed between the suscepter and the substrate to be processed, the heat exchange gases supplied from said first and second gas supply means differing from each other in composition.

* * * * *